United States Patent [19]

Monnerat

[11] Patent Number: 5,091,476
[45] Date of Patent: Feb. 25, 1992

[54] CYANATE ESTER RESIN BLENDS WITH BROMINATED STYRENE-CONTAINING POLYMERS

[75] Inventor: Georgia A. Monnerat, Lake Jackson, Tex.

[73] Assignee: The Dow Chemical Company, Midland, Mich.

[21] Appl. No.: 515,989

[22] Filed: Apr. 27, 1990

Related U.S. Application Data

[63] Continuation-in-part of Ser. No. 295,873, Jan. 11, 1989.

[51] Int. Cl.$^5$ .............................................. C08F 8/30
[52] U.S. Cl. .................................... 525/149; 428/461
[58] Field of Search ....................................... 525/149

[56] References Cited

U.S. PATENT DOCUMENTS

| | | | |
|---|---|---|---|
| 3,770,697 | 11/1973 | Holub et al. | 260/47 X |
| 4,578,439 | 3/1986 | Hefner | 525/509 |
| 4,904,760 | 2/1990 | Gaku et al. | 528/422 |

FOREIGN PATENT DOCUMENTS 0266986  5/1988  European Pat. Off. .

OTHER PUBLICATIONS

Chemical Abstract 91:92280w, vol. 91, 1979, p. 23.

Primary Examiner—John C. Bleutge
Assistant Examiner—D. E. Aylward

[57] ABSTRACT

The fire retardant properties of polycyanates are improved by blending them with a brominated homopolymer or brominated interpolymer of styrene or alkyl- or halo-substituted styrene without an unacceptable sacrifice in the physical, thermal, electrical and moisture resistance properties.

19 Claims, No Drawings

CYANATE ESTER RESIN BLENDS WITH BROMINATED STYRENE-CONTAINING POLYMERS

CROSS-REFERENCE TO RELATED APPLICATION

This application is a continuation-in-part of application serial no. 07/295,873 filed Jan. 11, 1989.

FIELD OF THE INVENTION

The present invention concerns blends of cyanate ester compounds and brominated polystyrene.

BACKGROUND OF THE INVENTION

Cyanate ester resins are generally considered to be high performance thermosetting resins at least to the extent that they usually exhibit high glass transition temperatures. In some applications such as in electrical laminates and the like it is desirable that they exhibit high fire retardant properties in that it is desirable that they exhibit an Underwriters Laboratory test no. 94 rating of V-0. The current industry standard cyanate ester resin is based on bisphenol A.

A typical method for obtaining ignition resistance in cyanate ester systems has been by the addition of brominated epoxy resins as disclosed by R. Kubens et al. in U.S. Pat. No. 3,562,214. Unfortunately, the addition of epoxy resins can result in a lower glass transition temperature, a decreased onset of thermal degradation, and a loss in moisture resistance with a corresponding increase in dielectric constant for the blended system.

Blends of non-brominated cyanate esters with brominated cyanate esters are disclosed by C. Burkhards et al. in U.S. Pat. No. 4,097,455, by G. W. Bogan and G. A. Monnerat in U.S. Pat. No. 4,806,625 and by J. P. Godschalx et al. in U.S. Pat. No. 4,782,178: however, this method to achieve flame resistance can be expensive. Blends of cyanate ester resins with ethylenically unsaturated reactive brominated monomers are disclosed by G. W. Bogan and P. A. Lucus in U.S. Pat. No. 4,746,727: however, some of these monomers, like bromostyrene, may suffer from volatility problems. Moreover, these approaches may still experience similar losses of performance as enumerated above with the brominated epoxy blends, or they may suffer from a lack of availability.

It would be desirable to have available, a cyanate ester resin composition which (1) has excellent flame resistance without an unacceptable sacrifice in the physical, thermal, electrical and moisture resistance properties which renders these cyanate ester resins desirable in such applications, (2) at the same time be reasonably affordable in terms of cost, and (3) maintains handling characteristics of an unmodified cyanate ester resin.

SUMMARY OF THE INVENTION

The present invention pertains to a blend comprising (A) at least one compound containing a plurality of —OCN groups: and (B) a brominated homopolymer or brominated interpolymer of styrene or alkyl- or halo-substituted styrene or any combination thereof: wherein components (A) and (B) are present in an amount such that the blend contains a bromine content of from about 4 to about 25 percent by weight based on the combined weight of components (A) and (B).

Another aspect of the present invention pertains to a curable composition comprising the aforementioned blend and a curing amount of a suitable curing agent therefor.

Another aspect of the present invention pertains to an article resulting from curing the aforementioned curable composition.

The present invention provides a cyanate ester resin composition which has excellent flame resistance without an unacceptable sacrifice in the physical, thermal, electrical and moisture resistance properties which renders these cyanate ester resins desirable in electrical laminate and encapsulation applications and at the same time be reasonably affordable in terms of cost. In some instances, one or more of the properties are actually improved.

DETAILED DESCRIPTION OF THE INVENTION

Suitable brominated polymers which can be employed herein include, for example the brominated homopolymers and brominated interpolymers of styrene, halo-or alkyl-substituted styrene, said alkyl groups having from 1 to about 10 carbon atoms. Particularly suitable brominated polymers include, for example, brominated homopolymers or brominated interpolymers of styrene, o-methylstyrene, p-methylstyrene, p-methylstyrene, 2,4-dimethylstyrene, 2,5-dimethylstyrene p-tert-butylstyrene, p-chlorostyrene, α-methylstyrene, combinations thereof and the like. Also suitable are the bromine-containing polymers resulting from polymerizing bromine-containing monomers such as, for example, bromostyrene, dibromostyrene, tribromostyrene, $C_1$–$C_4$ alkyl substituted monobromostyrene, $C_1$–$C_4$ alkyl substituted dibromostyrene, any combination thereof and the like as well as their interpolymers with any one or more non-bromo-containing polymerizable ethylenically unsaturated monomer as enumerated above.

The brominated polymers which can be employed herein include, for example, those which contain suitably from about 24 to about 70, more suitably from about 50 to about 68, most suitably from about 55 to about 68, percent bromine by weight: have a weight average molecular weight (Mw) suitably from about 750 to about 700,000, more suitably from about 2,000 to about 600,000, most suitably from about 2,000 to about 500,000: and a degree of polymerization (Dp) suitably from about 3 to about 3,000, more suitably from about 10 to about 2,500, most suitably from about 10 to about 2,300.

Suitable cyanate ester compounds employed in the present invention as the compound containing a plurality of —OCN groups are the cyanate esters of a hydrocarbon-aromatic hydroxyl containing compound which can be prepared by reacting a hydrocarbon-aromatic hydroxyl containing compound resin with cyanogen chloride or cyanogen bromide.

The hydrocarbon-aromatic hydroxyl containing compound resin can be prepared by reacting an unsaturated hydrocarbon or mixture of such hydrocarbons with an aromatic hydroxyl containing compound. Suitable methods as well as suitable aromatic hydroxyl containing compounds and unsaturated hydrocarbons are described by Vegter et al. in U.S. Pat. No. 3,536,734, Nelson in U.S. Pat. No. 4,390,680, Gebhart et al. in U.S. Pat. No. 3,557,239 and Nelson in U.S. Pat. No. 4,167,542, all of which are incorporated herein in their entirety.

Particularly suitable unsaturated hydrocarbons which, either in crude or purified state, can be employed include, for example, butadiene, isoprene, piperylene, cyclopentadiene, cyclopentene, 2-methylbutene-2, cyclohexene. cyclohexadiene, methyl cyclopentadiene, dicyclopentadiene, limonene, dipentene, linear and cyclic dimers of piperylene, methyl dicyclopentadiene, dimethyl dicyclopentadiene, norbornene, norbornadiene, ethylidine norbornene, mixtures thereof and the like. Also suitable unsaturated hydrocarbons include the other dimers, codimers, oligomers and cooligomers of the aforementioned unsaturated hydrocarbons. Particularly suitable unsaturated hydrocarbons which can be employed herein include, for example, a dicyclopentadiene concentrate containing from about 70 to about 100 percent by weight of dicyclopentadiene: from zero to about 30 percent by weight of $C_9$-$C_2$- dimers or codimers of $C_4$-$C_6$ dienes such as, for example, cyclopentadieneisoprene, cyclopentadiene-piperylene, cyclopentadienemethylcyclopentadiene, and/or dimers of isoprene, piperylene, methyl cyclopentadiene and the like: from about zero to about 7 percent by weight of $C_{14}$-$C_{18}$ trimers of $C_4$-$C_6$ dienes and from about zero to about 10 percent by weight of aliphatic diolefins such as, for example, piperylene, isoprene, 1,5-hexadiene and cyclic olefins such as cyclopentadiene, methyl cyclopentadiene, cyclopentene and the like. Methods of preparations for these dicyclopentadiene concentrates and more detailed descriptions thereof can be found collectively in the aforementioned U.S. Pat. No. 3,557,239 issued to Gebhart et al and U.S. Pat. No. 4,167,542 issued to Nelson.

Also, particularly suitable unsaturated hydrocarbons which can be employed include a crude dicyclopentadiene stream containing from about 10 to about 70 percent by weight dicyclopentadiene, from about 1 to about 10 percent codimers and dimers of $C_4$-$C_6$ hydrocarbons (described above), from about zero to about 10 percent oligomers of $C_4$-$C_6$ dienes and the balance to provide 100 percent, $C_4$-$C_6$ alkanes, alkenes and dienes.

Also, particularly suitable unsaturated hydrocarbons which can be employed include a crude piperylene or isoprene stream containing from about 30 to about 70 percent by weight piperylene or isoprene, about zero to about ten percent by weight $C_9$-$C_{12}$ and codimers of $C_4$-$C_6$ dienes, and the balance to provide 100 L30 percent by weight of $C_4$-$C_6$ alkanes, alkenes and dienes.

Also particularly suitable unsaturated hydrocarbons which can be employed include a composition comprising from about 95 percent to about 100 percent by weight of dicyclopentadiene and the balance, if any, to provide 100 percent by weight of $C_4$-$C_7$ saturated or unsaturated hydrocarbons or oligomers thereof.

Also, particularly suitable are hydrocarbon oligomers prepared by polymerization of the reactive components in the above hydrocarbon streams e.g., dicyclopentadiene concentrate, crude dicyclopentadiene, crude piperylene or isoprene, individually or in combination with one another or in combination with high purity diene streams.

Suitable aromatic hydroxyl-containing compounds which can be employed herein include those described in the aforementioned patents by Vegter et al., Gebhart et al. and Nelson. Suitable such aromatic hydroxylcontaining compounds include, for example, those compounds which contain one or two aromatic rings, at least one phenolic hydroxyl group and at least one ortho or para ring position with respect to a hydroxyl group available for alkylation. These and others are disclosed in the aforementioned patents by Vegter et al., Gebhart et al. and Nelson which have been incorporated herein by reference.

Particularly suitable aromatic hydroxylcontaining compounds which can be employed herein include, for example, phenol, chlorophenol, bromophenol, dimethylphenol, o-cresol, m-cresol, p-cresol, hydroquinone, catechol, resorcinol, guaiacol, pyrogallol, phloroglucinol, isopropylphenol, ethylphenol, propyiphenol, t-butyl-phenol, isobutylphenol, octylphenol, nonylphenol, cumylphenol, p-phenylphenol, o-phenylphenol, m-phenylphenol, Bisphenol A, dihydroxydiphenyl sulfone, mixtures thereof and the like.

The process of reacting the unsaturated hydrocarbon with the aromatic hydroxyl-containing compound can best be conducted in two steps.

In the first step, the unsaturated hydrocarbon is fed slowly into a mixture of the aromatic hydroxylcontaining compound and a suitable catalyst at temperatures suitably from about 40° C. to about 130° C., more suitably from about 50° C. to about 100° C., most suitably from about 60° C. to about 90° C. for a period of time sufficient to complete the addition of the unsaturated hydrocarbon while maintaining the exothermic reaction temperature within the above stated limits, suitably from about 0.25 to about 8, more suitably from about 0.5 to about 6, most suitably from about 1 to about 4 hours.

Suitable Lewis acid catalysts which can be employed herein include, for example, those described in the aforementioned U.S. Pat. No. 3,536,734 to Vegter et al. and U.S. Pat. No. 4,390,680 to Nelson. Particularly suitable catalysts include, for example, $BF_3$, $AlCl_3$, $FeCl_3$, $SnCl_4$, the coordination complexes thereof, and combinations thereof and the like.

The Lewis acid catalyst is employed in a catalytically effective amount, i.e. that amount which will sufficiently catalyze the reaction between the unsaturated hydrocarbon and the aromatic hydroxylcontaining compound at the particular reaction conditions employed. Usually, these amounts include that which provides a molar ratio of catalyst to aromatic hydroxylcontaining compound suitably from about 0.002:1 to about 0.1:1. more suitably from about 0.003:1 to about 0.05:1, most suitably from about 0.003:1 to about 0.01:1.

In the second step, the reaction mixture of the first step is allowed to digest at temperatures suitably from about 90° C. to about 180° C., more suitably from about 140° C. to about 150° C. for a period of time sufficient to substantially complete the reaction between the unsaturated hydrocarbon(s) and aromatic hydroxylcontaining compound(s), suitably from about 1 to about 8. more suitably from about 2 to about 6, most suitably from about 3 to about 4 hours.

The unsaturated hydrocarbon and the aromatic hydroxyl-containing compound are reacted in amounts which provide a molar ratio of aromatic hydroxylcontaining compound to unsaturated hydrocarbon suitably from about 1:1 to about 20:1, more suitably from about 2:1 to about 15:1, most suitably from about 3:1 to about 10:1. When the molar ratio is above about 20:1, reactor capacity is reduced by excess reactants and therefore effective yields are reduced. No particular advantage is seen for conducting the reaction at higher ratios. When the molar ratio is below about 1:1, incomplete reaction of the unsaturated hydrocarbon will likely occur, thus preventing complete conversion of the reactants to the desired product.

The resinous product can be recovered, if desired, from the reaction mixture by simply removing the excess aromatic hydroxyl-containing compound by distillation or the like. In the preparation of cyanate resins, the reaction mass can be reacted directly. without purification, with cyanogen, chloride or cyanogen bromide to produce a polycyanate resin.

The cyanate ester of the above resin prepared from one or more unsaturated hydrocarbons and one or more aromatic hydroxyl-containing compounds hereinafter referred to as unsaturated hydrocarbon/aromatic hydroxyl-containing resin can be prepared by the procedure described by D. J. Murray and E. P. Woo in U.S. Pat. No. 4,748,270 which is incorporated herein by reference in its entirety. The cyanate ester of the above unsaturated hydrocarbon/aromatic hydroxyl containing resin can also be prepared by the procedure described by Ernst Grigat and Rolf Putter in U.S. Pat. No. 3,553,244 which is incorporated herein by reference in its entirety.

The preferred compounds containing a plurality of —OCN groups are those represented by the following formula I

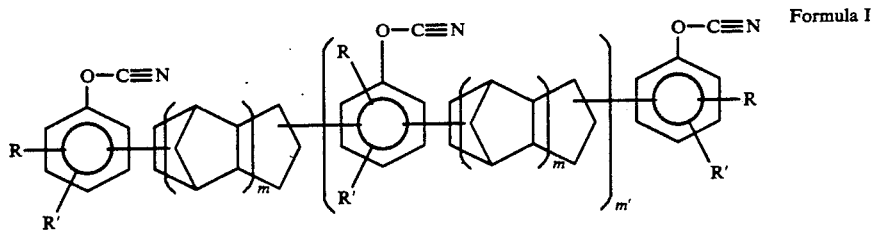

Formula I wherein each R and R' is independently hydrogen or a hydrocarbyl or hydrocarbyloxy group having suitably from 1 to about 12, more suitably from 1 to about 6, most suitably from 1 to about 4, carbon atoms or a halogen atom, preferably chlorine or bromine: each m independently has a value suitably from 1 to about 6, more suitably from 1 to about 3, most suitably from 1 to about 2, and m' has a value suitably from zero to about 4, more suitably from zero to about 2, most suitably from zero to about 0.4.

Other suitable compounds containing a plurality of —OCN groups include those represented by the following formulas II, III and IV

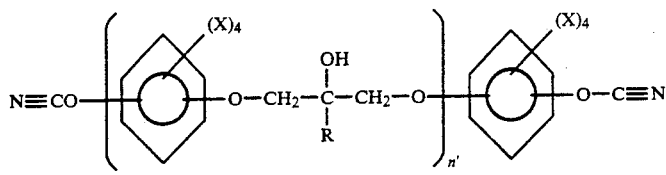

Formula II

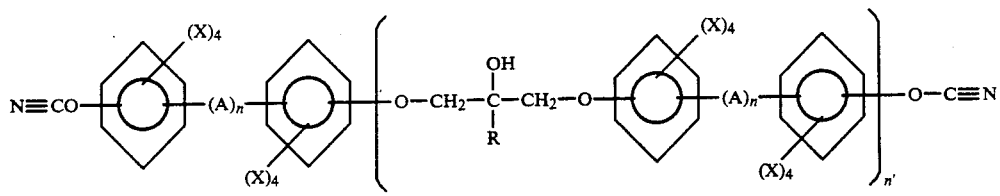

Formula III

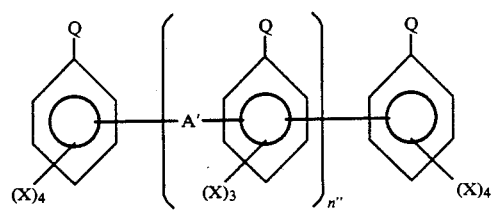

Formula IV wherein each A is independently a divalent hydrocarbyl group containing suitably from 1 to about 12, more suitably from 1 to about 6, most suitably from 1 to about 4 carbon atoms, —S—, —S—S—, —SO—, —SO$_2$—, —O—, or —CO—; each A' is independently a divalent hydrocarbyl group containing suitably from 1 to about 12, more suitably from 1 to about 6, most suitably from 1 to about 4 carbon atoms: each Q is independently a hydroxyl or —OCN group with the proviso that at least two of them are —OCN groups: R is hydrogen or an alkyl group having from 1 to about 4 carbon atoms: each X is independently hydrogen or a hydrocarbyl group containing suitably from 1 to about 12, more suitably from 1 to about 6, most suitably from 1 to about 4 carbon atoms or a halogen atom, preferably chlorine or bromine: n has a value of zero or 1; n' has an average value suitably from zero to about 5, more suitably from zero to about 3, most suitably from zero to about 2; and n" has an average value suitably from about 0.001 to about 4, more, suitably from about 0.001 to about 2, most suitably from about 0.001 to about 1.

The term hydrocarbyl as employed herein means any aliphatic, cycloaliphatic, aromatic, aryl substituted aliphatic or cycloaliphatic, or aliphatic or cycloaliphatic substituted aromatic groups. The aliphatic groups can be saturated or unsaturated. Likewise, the term hydrocarbyloxy means a hydrocarbyl group having an oxygen linkage between it and the carbon atom to which it is attached.

Particularly suitable other cyanate ester compounds include, for example, bisphenol A dicyanate, bisphenol K dicyanate, bisphenol F dicyanate, methylene bis (3,5-dimethylphenyl-4-cyanate), 4,4'-thiodiphenylcyanate, polycyanate of phenol-formaldehyde novolac resins, polycyanate of cresol-formaldehyde novolac resins, combinations thereof and the like.

The cyanate ester containing compound and the brominated styrene polymers or resins are blended in amounts which provide the resultant blend with a bromine content suitably from about 4 to about 25, more suitably from about 8 to about 20, most suitably from about 10 to about 18, percent bromine by weight based upon the combined weight of the cyanate containing compound and the brominated styrene polymer or resin.

Suitable curing agents for the compositions of the present invention include, for example, acids, bases, nitrogen or phosphorus compounds, transition metal salts or complexes, combinations thereof and the like, such as metal salts of aliphatic and aromatic carboxylic acids, tertiary amines, and the like. Particularly suitable curing agents include, for example, cobalt octoate, cobalt naphthenate, cobalt acetylacetonate, zinc octoate, zinc naphthenate, tin octoate, diazobicyclo-(2,2,2)-octane, triethylamine, combinations thereof and the like.

If desired, the compositions can be blended with other compounds such as, for example, solvents, fillers, mold release agents, pigments, dyes, flow modifiers, combinations thereof and the like.

Suitable such solvents include, for example, halogenated hydrocarbons, aromatic hydrocarbons, cyclic ethers, amides, ketones, combinations thereof and the like. Particularly suitable solvents include, for example, dimethylformamide, tetrahydrofuran, methylethylketone, methylene chloride, combinations thereof and the like.

Suitable such fillers include, for example, graphite, carbon, metals, glass, natural and synthetic materials, combinations thereof and the like in the form of matts, monofiliments, multifilaments, woven fibers, powders, rovings, and the like. Particularly suitable fillers include, glass fibers, graphite or carbon fibers, combinations thereof and the like.

The blends of the present invention can be employed in the preparation of coatings, laminates, composites, castings, moldings and the like.

In the preparation of laminates, the blends are mixed with a curing agent and applied to a substrate material. Then two or more plies of the impregnated substrate are subjected to heat and pressure resulting in a laminate or composite. Electrical laminates are prepared in the same manner as the laminates or composites except that they contain at least one outer layer of an electrical conducting material.

Suitable substrate materials for preparing the laminates and composites include, for example, glass, nylon, rayon, polyamide, graphite, and the like. The substrate materials can be in the form of woven fabric, mat, monofilament, multifilament rovings, and the like.

Suitable electrical conducting materials for use in the electrical laminates include, for example, gold, silver, copper, aluminum, and the like.

The following examples are illustrative of the invention, but are not to be construed as to limiting its scope in any manner.

The following components are employed in the examples and comparative experiments.

Component A is a cyanate containing resin prepared by cyanating with cyanogen chloride the reaction product of dicyclopentadiene containing three percent or less of codimers and unreactive lights and phenol, said reaction product having an average phenolic hydroxyl functionality of about 2.25 and a phenolic equivalent weight of 163 to 168. The cyanate equivalent weight is 191 (calculated).

Component B is a brominated polystyrene resin having a bromine content of about 60-62 percent by weight, a weight average molecular weight (Mw) of about 470,000 and a Dp of 1,700-2,200.

Component C is bromostyrene monomer.

Component D is the reaction product of vinyl benzyl chloride and tetrabromobisphenol A. The resultant vinylbenzyl ether product has a bromine content of 41.2 percent by weight.

Component E is a brominated vinyl ester resin (60% non-volatiles in styrene) containing 33.3 percent bromine by weight based o non-volatiles only.

Component F is a polycarbonate resin prepared by reacting phosgene with tetrabromobisphenol A. The resultant brominated polycarbonate has a Mw of 100,000 to 200,000 and a bromine content of 56 percent by weight.

Component G is a brominated polystyrene resin having a bromine content of about 68 percent by weigh and a Mw of about 2000. The resin is available from the Ferro Corp. as Pyro-Chek LM.

Component H is the dicyanate ester of bisphenol A available from the Mitsubishi Gas Co. under the name BT-2000.

Component I is a brominated polystyrene resin having a bromine content of about 60.3 percent by weight and a weight average molecular weight (Mw) of about 450,000–480,000.

Component J is a brominated polystyrene resin having a bromine content of about 60 percent and a molecular weight (Mw) of about 215,000. The resin is available from the Ferro Corp. as Pyro-Chek 60PB.

Component K is a diglycidyl ether of tetrabromobisphenol A with a bromine content of 18-20 percent and an epoxide equivalent weight of 405-425.

Component L is a brominated polystyrene resin having a bromine content of about 60 percent and a molecular weight (Mw) of about 10,000 prepared by the

EXAMPLE 1

Blending of Resins 19.7 grams of brominated polystyrene (Component B) are dissolved in 50 ml of tetrahydrofuran. To this mixture are added 80.3 grams of a cyanate ester resin (Component A). The mixture is placed on aluminum foil in a vacuum oven to remove the solvent. During the first hour, the temperature is 128° C. or less. The vacuum is approximately 25 inches (635 mm) Hg. After the first hour, the temperature varies between 128° C. and 137° C. The vacuum is increased to 28 to 29 inches Hg. After a total of 2⅔ hours, the resin blend is removed from the oven and allowed to cool. The resulting product contains approximately 12% bromine by weight.

Casting and Curing of Resin Blend

Seventy grams of the above material are heated in a 130° C. oven. To this is added 1.75 grams of a catalyst solution. The solution has been made by dissolving 0.32 gram of cobalt (III) acetylacetonate in 5 grams of divinylbenzene. The resin-catalyst blend is well mixed, then degassed under a bell jar using vacuum. The degassed material is poured into a glass mold, the internal surfaces of which are treated with Release All #30. The mold is placed in an oven preheated to 177° C. After one hour, the temperature is raised to 225° C., followed by 2½ hours at 250° C. This casting is tested for flammability by the UL 94 test.

EXAMPLE 2

Blending of Resins 13.1 grams of brominated polystyrene (Component B) are dissolved in 50 ml of tetrahydrofuran. To this mixture is added 86.9 grams of a cyanate ester resin (Component A). The mixture is placed on aluminum foil in a vacuum oven to remove the solvent. During the first hour, the temperature is 128° C. or less. The vacuum is approximately 25 inches Hg. After the first hour, the temperature varies between 128° C. and 137° C. The vacuum is increased to 28 to 29 inches (711–736 mm) Hg. After a total of 2⅝ hours, the resin blend is removed from the oven and allowed to cool. The resulting product contains approximately 8% bromine.

Casting and Curing of Resin Blend 70 grams of the above material are heated in a 130° C. oven. To this heated mixture is added 1.75 grams of a catalyst solution. The solution has been made by dissolving 0.32 gram of cobalt (III) acetylacetonate in 5 grams of divinylbenzene. The resin-catalyst blend is well mixed, then degassed under a bell jar using vacuum. The degassed material is poured into a glass mold, the internal surfaces of which are treated with Release All #30. The mold is placed in an oven preheated to 177° C. After one hour, the temperature is raised to 225° C., followed by 2 ½ hours at 250° C. This casting is tested for flammability by the UL 94 test.

EXAMPLE 3

Blending of Resins 52.5 grams of brominated polystyrene (Component B) are dissolved in 75 ml tetrahydrofuran (THF) This is blended into 347.5 gm of cyanate ester resin (Component A) preheated to 90° C. The blend is placed into a vacuum oven at 115° C. to 125° C. for 1.75 hours under a maximum vacuum of 29 to 30 in. (736-762 mm) Hg.

Casting and Curing of Resin Blend 4.54 gm of catalyst solution is added to the blend. The solution has been made by dissolving 1.5 gm cobalt (III) acetylacetonate in 28.5 gm of divinylbenzene. The resin-catalyst blend is well mixed, then degassed under a bell jar using vacuum. The degassed material is poured into an aluminum mold, the internal surfaces of which are treated with a 5% by wt. solution of Dow Corning 20 silicone oil in isopropanol as a mold release agent. The mold is placed in an oven preheated to 175° C. for one hour. Then the temperature is raised to 225° C. for one hour, followed by 2 hours at 50° C. The physical and electrical properties of the cured product are given in Table I.

EXAMPLE 4

Blending of Resins 20.45 grams of brominated polystyrene (Component G) are dissolved in 100 ml of methylene chloride. To this mixture are added 55.0 grams of a cyanate ester resin (Component A). After the cyanate ester is dissolved in the solvent, the solvent is removed using a rotary evaporator. The maximum temperature reached is 165° C. and the maximum vacuum obtained is 10 mm Hg. The solvent removal requires about 32 minutes. The resulting product contains approximately 18 percent bromine by weight.

Casting and Curing of Resin Blend 65.9 grams of the above material are heated in a 150° C. oven until the material becomes pourable. To this is added 1.65 grams of a catalyst solution. The solution is made by dissolving 0.771 gram of cobalt (III) acetylacetonate in 12 grams of divinylbenzene. The resin-catalyst blend is well mixed, then degassed under a bell jar using vacuum. The degassed material is poured into a preheated (177° C.) glass mold, the internal surfaces of which are treated with Release All #30 as a mold release agent. The mold is placed in an oven preheated to 177° C. After seventy minutes, the temperature is raised between 220° C. to 225° C. for an hour, followed by two hours at 248° C. to 250° C. The thermal, electrical and moisture resistance properties are given in Table I.

EXAMPLE 5

Blending of Resins 44.78 grams of brominated polystyrene (Component I) and 105.22 grams of cyanate ester resin (Component H) are mixed in 300 ml of methylene chloride. The solvent is removed using a rotary evaporator. The maximum temperature reach is 170° C. and the maximum vacuum obtained is 10 mm Hg. The solvent removal requires about 38 minutes. The resulting product contains approximately 18 percent bromine by weight.

Casting and Curing of Resin Blend 139.3 grams of the above material are heated in a 177° C. oven until the material becomes pourable. To this is added 3.48 grams of a catalyst solution. The solution is made by dissolving 0.835 gram of cobalt (III) acetylacetonate in 13 grams of divinylbenzene. The resin-catalyst blend is well mixed, then degassed under a bell jar using vacuum. The degassed material is poured into a preheated (177° C.) aluminum mold, the internal surfaces of which are treated with a five percent by weight solution of Dow Corning DC-20 silicone oil in isopropanol as a mold release agent. The mold is placed in an oven preheated to 177° C. for one hour, followed by four hours at 225° C. After several days the casting is postcured for two hours at 250° C. The electrical, thermal, and moisture resistance properties are give in Table I.

EXAMPLE 6

Blending of Resins 15.0 grams of brominated polystyrene (Component L) are dissolved in 100 ml of methylene chloride. To this mixture are added 60.0 grams of a cyanate ester resin (Component A). After the cyanate ester is dissolved in the solvent, the solvent is removed using a rotary evaporator. The maximum temperature reached is 139° C. and the maximum vacuum obtained is 9 mm Hg. The solvent removal requires about 48 minutes. The resulting product contains approximately 12% bromine by weight.

Casting and Curing of Resin Blend 68.3 grams of the above material are heated in a 150° C. oven until the material becomes pourable. To this is added 1.48 grams of a catalyst solution. The solution is made by dissolving 2.25 grams of cobalt (III) acetylacetonate in 35 grams of divinylbenzene. The resin-catalyst blend is well mixed, then degassed under a bell jar using vacuum. The degassed material is poured into a preheated (175° C.) glass mold, the internal surfaces of which have been treated with Release All #30 as a mold release agent. The mold is placed in an oven preheated to 177° C. After 1, hours, the temperature is raised to 250° C. for two hours. The thermal, electrical and moisture resistance properties are given in Table I.

COMPARATIVE EXPERIMENT A 600 grams of a cyanate ester resin (Component A) are heated in a 120° C. oven. To this is added 6.8 grams of a 10% catalyst mixture of cobalt (III) acetylacetonate in divinylbenzene. The resin-catalyst blend is well mixed, then degassed under a bell jar using vacuum. The degassed material is poured into an aluminum mold, the internal surfaces of which are treated with a 5% by wt. solution of Dow Corning 20 silicone oil in isopropanol as a mold release agent. The mold is placed in an oven preheated to 100° C. After one hour, the temperature is increased to 175° C. for one hour, and then the temperature is raised to 225° C. for one hour, followed by 2 hours at 250° C. The physical and electrical properties of the cured product are given in Table I.

COMPARATIVE EXPERIMENT B

Blending of Resins 73.3 grams of bromostyrene monomer (Component C) are weighed into 326.7 grams of a cyanate ester resin (Component A), preheated to 100° C. The resulting product contains approximately 8% bromine.

Casting and Curing of Resin Blend

To this heated mixture is added 4.54 grams of a catalyst solution. The catalyst solution is made by dissolving 1.5 grams of cobalt (III) acetylacetonate in 28.5 grams of divinylbenzene. The resin-catalyst blend is well mixed, then degassed under a bell jar using vacuum. The degassed material is poured into an aluminum mold, the internal surfaces of which are treated with a 5% by wt. solution of Dow Corning 20 silicone oil in isopropanol as a mold release agent. The mold is placed in an oven preheated to 125° C. After one hour, the temperature is raised to 175° C. for one hour, followed by one hour at 225° C. and then 2 hours at 250° C. The physical and electrical properties of the cured product are given in Table I.

COMPARATIVE EXPERIMENT C

Blending of Resins 77.7 grams of the reaction product of vinyl benzyl chloride and tetrabromobisphenol A (Component D) are blended with 329.3 grams of a cyanate ester resin (Component A) preheated to 100° C. The resulting product contains approximately 8% bromine.

Casting and Curing of Resin Blend

To this heated mixture is added 4.54 grams of a catalyst solution. The catalyst solution is made by dissolving 1.5 grams of cobalt (III) acetylacetonate in 28.5 grams of divinylbenzene. The resin-catalyst blend is well mixed, then degassed under a bell jar using vacuum. The degassed material is poured into an aluminum mold, the internal surfaces of which are treated with a 5% by wt. solution of Dow Corning 20 silicone oil in isopropanol as a mold release agent. The mold is placed in an oven preheated to 175° C. After one hour, the temperature is raised to 225° C. for one hour, followed by 2 hours at 250° C. The physical and electrical properties of the cured product are given in Table I.

COMPARATIVE EXPERIMENT D

Blending of Resins 160 grams of 60% by wt. brominated vinyl ester resin in styrene (Component E) are blended with 304 grams of a cyanate ester resin (Component A). The mixture is placed in a vacuum oven for 3.5 hours at 72° C. to 84° C. to remove the styrene. The vacuum is approximately 29 to 30 inches Hg. The product is stored in a freezer until used. The product is transferred to a round bottom stripping flask and is stripped on a rotary evaporator at 80° C. to 85° C. under a vacuum (10 mm Hg). The resulting product contains approximately 8% bromine.

Casting and Curing of Resin Blend

To this heated mixture is added 4.54 grams of a catalyst solution, containing 5% by wt. cobalt (III) acetylacetonate in divinylbenzene. The resin-catalyst blend is well mixed, then degassed on the rotary evaporator under vacuum. The degassed material is poured into an aluminum mold, the internal surfaces of which are treated with a 5% by wt. solution of Dow Corning 20 silicone oil in isopropanol as a mold release agent. The mold is placed in an oven preheated to 175° C. After one hour, the temperature is raised to 225° C. for two hours. The physical and electrical properties of the cured product are given in Table I.

COMPARATIVE EXPERIMENT E

Blending of Resins 57.0 grams of brominated polycarbonate (Component G) are dissolved in 250 ml of tetrahydrofuran and poured into a round bottom flask containing 343 grams of a cyanate ester resin (Component A). The mixture is heated under vacuum (8 mm Hg) on a rotary evaporator at a maximum temperature of 170° C. for approximately one hour. The resulting product contains approximately 8% bromine.

Casting and Curing of Resin Blend

The above material is then poured into an aluminum mold, the internal surfaces of which are treated with a 5% by wt. solution of Dow Corning 20 silicone oil in isopropanol as a mold release agent. The mold after sitting overnight at room temperature is placed in an oven preheated to 175° C. After one hour, the temperature is raised to 225° C. for one hour, followed by 2 hours at 250° C. The moisture resistance and electrical properties of the cured product are given in Table I.

COMPARATIVE EXPERIMENT F 400 grams of a cyanate ester resin (Component A) are heated in a 140° C oven. To this is added 10.0 grams of a catalyst solution. The solution is made by dissolving 2.25 grams of cobalt (III) acetylacetonate in 35 grams of divinylbenzene. The resin-catalyst blend is well mixed, then degassed under a bell jar using vacuum. The degassed material is poured into a preheated (175° C.) glass mold, the internal surfaces of which have been treated with Release All #30 as a mold release agent. The mold is placed in an oven preheated to 177° C. After 1 hour, the temperature is raised to 250° C. and held for two hours. The electrical, thermal, and moisture resistance properties are given in Table I.

COMPARATIVE EXPERIMENT G 140 grams of a cyanate ester resin (Component H) are heated in a 130° C. oven. To this is added 3.5 grams of a catalyst solution. The solution is made by dissolving 0.835 gram of cobalt (III) acetylacetonate in 13 grams of divinylbenzene. The resin-catalyst blend is well mixed, then degassed under a bell jar using vacuum. The degassed material is poured into a preheated (177° C.) aluminum mold, the internal surfaces of which have been treated with a 5% by wt. solution of Dow Corning DC-20 silicone oil in isopropanol as a mold release agent. The mold is placed in an oven preheated to 177° C. for one hour, followed by four hours at 225° C. After several days, the casting is postcured at 250° C. for two hours. The electrical, thermal, and moisture resistance properties are given in Table I.

TABLE I

| PROPERTY | Ex. 1 | Ex. 2 | Ex. 3 | Ex. 4 | Ex. 5 | Ex. 6 |
|---|---|---|---|---|---|---|
| Component, % by weight | A, 86.9 B, 13.1 | A, 80.3 B, 19.7 | A, 86.9 B, 13.1 | A, 72.9 G, 27.1 | H, 70.1 I, 29.9 | A, 80 L, 20 |
| % Br in formulation | 8 | 12 | 8 | 18.4 | 18 | 12 |
| Flex. Str.[1] | | | | | | |
| psi | — | — | 15,846 | — | — | — |
| MPa | | | 109 | 1 | | |
| Flex. Mod.[2] | | | | | | |
| psi | — | — | 499,744 | — | — | — |
| MPa | | | 3,443 | | | |
| Tensile Str.[3] | | | | | | |
| psi | — | — | 10,874 | — | — | — |
| MPa | | | 75 | | | |
| Tensile Mod.[4] | | | | | | |
| psi | — | — | 466,769 | — | — | — |
| MPa | | | 3,216 | | | |
| % Elongation[5] | — | — | 3.0 | — | — | — |
| Dielect. Constant[6] | | | | | | |
| Initial | — | — | 2.91 | 2.83 | 2.94 | 2.78 |
| After Moist. Exp.[7] | | | 3.35 | 3.49 | 3.58* | 3.26 |
| Tg (DSC), °C.[8] | — | — | 255 | 259.9 | >270 | 264 |
| Tg (TMA) °C.[9] | — | — | 241 | — | — | 230 |
| UL 94 Flame Rating[10] | V0** | V1** | — | — | — | — |
| Onset of Degradation, °C.[12] | — | — | 424.6 | — | — | 418 |
| Moisture Resistance, % Wt. Gain[7] | | | | | 1.93* | 1.29 |

*100 hours in autoclave instead of 500 hours.
**This numberical rating is for comparative purposes only and is not an indication of how the composition might perform under actual fire conditions.

| PROPERTY | A* | B* | C* | D* | E* | F* | G* |
|---|---|---|---|---|---|---|---|
| Component, % by weight | A, 100 | A, 81.7 C, 18.3 | A, 80.6 D, 19.4 | A, 76 E, 24 | A, 85.7 F, 14.3 | A, 100 | H, 100 |
| % Br in formulation | None | 8 | 8 | 8 | 8 | None | None |
| Flex. Str.[1] | | | | | | | |
| psi | 17,695 | 17,613 | 16,694 | 17,860 | 18,694 | — | — |
| MPa | 122 | 121 | 115 | 123 | 129 | | |
| Flex. Mod.[2] | | | | | | | |
| psi | 465,718 | 514,842 | 513,825 | 501,824 | 492,372 | — | — |
| MPa | 3,209 | 3,547 | 3,540 | 3,458 | 3,392 | | |
| Tensile Str.[3] | | | | | | | |
| psi | 9,923 | 11,804 | 9,486 | 9,902 | 10,248 | — | — |
| MPa | 68 | 81 | 65 | 68 | 71 | | |
| Tensile Mod.[4] | | | | | | | |
| psi | 489,918 | 501,693 | 486,040 | 472,234 | 494,343 | — | — |
| MPa | 3,376 | 3,457 | 3,349 | 3,254 | 3,406 | | |
| % Elongation[5] | 2.2 | 3.0 | 2.3 | 2.3 | 2.7 | — | — |
| Dielect. Constant[6] | | | | | | | |
| Initial | 2.86 | 2.84 | 2.98 | 2.87 | 2.87 | 2.80 | 2.97 |
| After Moist. Exp.[7] | 3.47 | 3.17 | 3.85 | 3.33 | Broke[11] | 3.35 | 3.72* |
| Tg (DSC), °C.[8] | 263 | 244 | 258 | 233 | 255 | 269 | >270 |
| Tg (TMA) °C.[9] | 241 | 223 | 224 | 206 | 237 | 246 | — |

TABLE I-continued

EXAMPLE NUMBER OR COMPARATIVE EXPERIMENT LETTER

| | | | | | | | |
|---|---|---|---|---|---|---|---|
| UL 94 Flame Rating[10] | — | — | — | — | — | — | — |
| Onset of Degredation, °C.[12] | 421.4 | 418.9 | 326.9 | 335.8 | 371.4 | 433 | — |
| Moisture Resistance, % wt. gain[7] | | | | | — | 1.71 | 2.48** |

*Not an example of the present invention.
**100 hours in autoclave instead of 500 hours.
Footnotes to Table I.
[1]Flexural strength determined by ASTM D790 (1984) on 1" × 3" × ⅛" (25.4 mm × 76.2 mm × 3.2 mm) coupons.
[2]Flexural modulus determined by ASTM D790 (1984) on 1" × 3" × ⅛" (25.4 mm × 76.2 mm × 3.2 mm) coupons.
[3]Tensile strength determined by ASTM D638 (1984).
[4]Tensile modulus determined by ASTM D638 (1984).
[5]Elongation determined by ASTM D638 (1984).
[6]Electrical properties determined on 3⅜" × 3" × ⅛" (85.7 mm × 76.2 mm × 3.2 mm) specimens. The surfaces are wiped with acetone prior to testing on a Gen Rad Precision 1689 RLC Digibridge equipped with a LD-3 specimen cell.
[7]Determined after sample is exposed in an autoclave containing a pan of water at 15 psig (103.4 kPa) and 250° F. (121.1° C.) for 500 hours.
[8]Glass transition temperature determined by differential scanning calorimetry (DSC).
[9]Glass transition temperature determined by thermal mechanical analysis (TMA).
[10]Determined by Underwriters Laboratory UL 94 Flame spread test.
[11]The coupon broke before property could be determined.
[12]Onset of thermal degradation is determined by thermal gravimetric analysis (TGA). Cured samples are run on a Dupont 1090 Thermal analyzer equipped with a TGA module #951 with a 200 cc/min. flow of $N_2$. The temperature is increased at a rate of 10° C./min.

EXAMPLE 7

4000 grams of cyanate ester resin (Component A) are dissolved in 1600 grams of dimethylformamide and 100 grams of methyl ethyl ketone. To this solution are added 840 grams brominated polystyrene (Component G). To this solution are added 32 grams of a 10% catalyst mixture of zinc octoate. This solution is well mixed for one hour on horizontal shaking device. This solution varnish is then used to preimpregnate 7628 style fiber glass and is heated to 350° F. (160° C.) for 2.5 minutes. These B-staged prepregs are then cut into 12"×12" (304.8×304.8 mm) sheets. These sheets are then stacked (eight in a book) and placed in 14"×14" (355.7×355.6 mm) lamination press. The press is operated with the following pressing parameters:
Step 1:
    Temperature = 200° F. (93.3° C.)
    Force = 72,000 pounds (32,659 kg)
Step 2:
    Temperature is ramped from 200° F. to 290° F. (93.3° C.-143.3° C.) at a rate of 4° F. (2.2° C.)/min.
    Force held constant at 72,000 pounds (32,659 kg).
Step 3:
    Temperature is ramped from 290° F. to 350° F. (143.3° C.-176.7° C.) at a rate of 20° F./min.
    Force held constant at 72,000 pounds (32,659 kg).
    This condition is held constant for a duration of one hour.
Step 4:
    Temperature is ramped from 350° F. to 200° F. (176.7° C.-93.3° C.) at a rate of 8° F. (4.4° C.)/min.
Step 5:
    Force is reduced to zero applied pounds.
The cured laminate is then post-baked at 225° C. in a convection oven. The physical and electrical properties of the cured product are given in Table II.

EXAMPLE 8

4000 grams of cyanate ester resin (Component A) are dissolved in 1680 grams of dimethylformamide and grams of methyl ethyl ketone. To this solution are added 1000 grams brominated polystyrene (Component J). To this solution are added 18 grams of a 10% catalyst mixture of zinc octoate. This solution is well mixed for one hour on horizontal shaking device. This solution varnish is then used to preimpregnate 7628 style fiber glass and is heated to 350° F. (176.7° C.) for 2.5 minutes. These B-staged prepregs are then cut into 12"×12" (304.8×304.8 mm) sheets. These sheets are then stacked (eight in a book) and placed in 14×14" (355.6×355.6 mm) lamination press. The press is operated with the following pressing parameters:
Step 1:
    Temperature = 200° F. (93.3° C.)
    Force = 72,000 pounds (32,659 kg).
Step 2:
    Temperature is ramped from 200° F. to 290° F. (93.3° C.-143.3° C.) at a rate of 4° F./min. Force held constant at 72,000 pounds (32,659 kg).
Step 3:
    Temperature is ramped from 290° F. to 350° F. (143.3° C.-176.7° C.) at a rate of 20° F./min.
    Force held constant at 72,000 pounds (32,659 kg).
    This condition is held constant for a duration of one hour.
Step 4:
    Temperature is ramped from 350° F. to 200° F. (176.7° C.-93.3° C.) at a rate of 8° F./min.
Step 5:
    Force is reduced to zero applied pounds.
The cured laminate is then post-baked at 225° C. in a convection oven. The physical and electrical properties of the cured product are given in Table II.

EXAMPLE 9

4000 grams of cyanate ester resin (Component A) are dissolved in 1640 grams of dimethylformamide and grams of methyl ethyl ketone. To this solution are added 960 grams brominated polystyrene (Component B). To this solution are added 9.2 grams of a 10% catalyst mixture of zinc octoate. This solution is well mixed for one hour on horizontal shaking device. This solution varnish is then used to preimpregnate 7628 style fiber glass and is heated to 350° F. (176.7° C.) for 2.5 minutes.

These B-staged prepregs are then cut into 12"×12" (304.8×304.8 mm) sheets. These sheets are then stacked (eight in a book) and placed in 14"×14" (355.6×355.6 mm) lamination press. The press is operated with the following pressing parameters:

Step 1:
  Temperature = 200° F. (93.3° C.)
  Force = 72,000 pounds (32,659 kg)
Step 2:
  Temperature is ramped from 200° F. to 290° F. (93.3° C.–143.3° C.) at a rate of 4° F. (2.2° C.)/min.
  Force held constant at 72,000 pounds (32,659 kg).
Step 3:
  Temperature is ramped from 290° F. to 350° F. (143.3° C.–176.7° C.) at a rate of 20° F. (11.1° C.)/min.
  Force held constant at 72,000 pounds (32,659 kg). This condition is held constant for a duration of one hour.
Step 4:
  Temperature is ramped from 350° F. to 200° F. (176.7° C.–93.3° C.) at a rate of 8° F. (4.4° C.)/min.
Step 5:
  Force is reduced to zero applied pounds.

The cured laminate is then post-baked at 225° C. in a convection oven. The physical and electrical properties of the cured product are given in Table II.

EXAMPLE 10

1600 grams of cyanate ester resin (Component A) are dissolved in 656 grams of dimethylformamide and 282 grams of methyl ethyl ketone. To this solution are added 400 grams brominated polystyrene (Component L). To this solution are added 51.4 grams of a 1.0% catalyst mixture of zinc octoate. This solution is well mixed for one hour on horizontal shaking device. This solution varnish is then used to pr impregnate 7628 style fiber glass and is heated to 350° F. (176.7° C.) for 2.5 minutes. These B-staged prepregs are then cut into 12"×12" (304.8 mm×304.8 mm) sheets. These sheets are then stacked (eight in a book) and placed in 14"×14" (355.6 mm×355.6 mm) lamination press. The press is operated with the following pressing parameters:

Step 1:
  Temperature = 200° F. (93.3° C.)
  Force = 72,000 pounds (32,659 kg)
Step 2:
  Temperature is ramped from 200° F. to 290° F. (93.3° C. to 143.3) at a rate of 4° F. (2.22° C.)/min.
  Force held constant at 72,000 pounds (32,659 kg).
Step 3:
  Temperature is ramped from 290° F. to 350° F. (143.3° C. to 176.7° C.) at a rate of 20° F./min.
  Force held constant at 72,000 pounds (32,659 kg). This condition is held constant for a duration of one hour.
Step 4:
  Temperature is ramped from 350° F. to 200° F. (176.7° C. to 93.3° C.) at a rate of 8° F. (4.4° C./min.)
Step 5:
  Force is reduced to 0 applied pounds.

The cured laminate is then post-baked for two hours at 225° C. in a convection oven.

The physical and electrical properties of the cured product are given in Table II.

COMPARATIVE EXPERIMENT H 5000 grams of cyanate ester resin (Component A) are dissolved in 1665 gram of dimethylformamide and 200 grams of methyl ethyl ketone. To this solution are added 12.5 grams of a 10% catalyst mixture of zinc octoate. This solution is well mixed for one hour on horizontal shaking device. This solution varnish is then used to preimpregnate 7628 style fiber glass and is heated to 350° F. (176.7° C.) for 2.5 minutes. These B-staged prepregs are then cut into 12×12" (304.8×304.8 mm) sheets. These sheets are then stacked (eight in a book) and placed in 14"×14" (355.6×355.6 mm) lamination press. The press is operated with the following pressing parameters:

Step 1:
  Temperature = 200° F. (93.3° C.)
  Force = 72,000 pounds (32,659 kg)
Step 2:
  Temperature is ramped from 200° F. to 290° F. (93.3° C.–143.3° C.) at a rate of 4° F. (2.2° C.)/min.
  Force held constant at 72,000 pounds (32,659 kg).
Step 3:
  Temperature is ramped from 290° F. to 350° F. (143.3° C.–176.7° C.) at a rate of 20° F. (11.1° C.)/min.
  Force held constant at 72,000 pounds (32,659 kg). This condition is held constant for a duration of one hour.
Step 4:
  Temperature is ramped from 350° F. to 200° F. (176.7° C.–93.3° C.) at a rate of 8° F. (4.4° C.)/min.
Step 5:
  Force is reduced to zero applied pounds.

The cured laminate is then post-baked at 225° C. in a convection oven. The physical and electrical properties of the cured product are given in Table II.

COMPARATIVE EXPERIMENT I 3200 grams of brominated epoxy resin (Component K) are dissolved in 800 grams of acetone. To this solution are added 86 grams of dicyandiamide dissolved in a solution of 389 grams of ethylene glycol methyl ether and 389 grams of dimethylformamide. To this resin solution are added 32 grams of a 10% catalyst solution in dimethylformamide. This solution is well mixed for one hour on a horizontal shaking device. This solution varnish is then used to preimpregnate 7628 style fiber glass and is heated to 350° F. (176.7° C.) for 2.5 minutes. These B-staged prepregs are then cut into 12"×12" (304.8×304.8 mm) sheets. These sheets are then stacked (eight in a book) and placed in 14"×14" (355.6×355.6 mm) lamination press. The press is operated with the following pressing parameters:

Step 1:
  Temperature = 200° F. (93.3° C.)
  Force = 72,000 pounds (32,659 kg)
Step 2:
  Temperature is ramped from 200° F. to 290° F. (93.3° C.–143.3° C.) at a rate of 4° F. (2.2° C.)/min.
  Force held constant at 72,000 pounds (32,659 kg).
Step 3:

Temperature is ramped from 290° F. to 350° F. (143.3° C.–176.7° C.) at a rate of 20° F. (11.1° C.)/min.

Force held constant at 72,000 pounds (32,659 kg).

This condition is held constant for a duration of one hour.

Step 4:

Temperature is ramped from 350° F. to 200° F. (176.7° C.–93.3° C.) at a rate of 8° F. (4.4° C.)/min.

Step 5:

Force is reduced to zero applied pounds.

No additional post-cure was performed. The thermal and electrical properties of the cured product are given in Table II.

TABLE II

| | Example or Comparative Experiment | | | | | |
|---|---|---|---|---|---|---|
| | Ex. 7 | Ex. 8 | Ex. 9 | Ex. 10 | C.E. H* | C.E. I* |
| Glass Transition Temp., °C. | 213 | 231 | 237 | 225 | 243 | 132 |
| Coefficient of Thermal Expansion, ppm/°C. | 53 | 90 | 79 | 77 | 47 | 72 |
| Dielectric | 3.8 | 3.7 | 3.9 | 3.7 | 3.9 | 5.1 |
| Constant Dissapation Factor | 0.0022 | 0.0036 | 0.0028 | 0.002_ | 0.0035 | 0.0193 |

*Not an example of the invention.

What is claimed is:

1. A blend comprising (A) at least one compound containing a plurality of —OCN groups; and (B) a brominated homopolymer or brominated interpolymer of styrene or alkyl- or halo-substituted styrene or any combination thereof, which polymer has a weight average molecular weight of from about 2000 to about 700,000; wherein components (A) and (B) are present in an amount such that the blend contains a bromine content of from about 4 to about 25 percent by weight based on the combined weight of components (A) and (B).

2. A blend of claim 1 wherein components (A) and (B) are present in an amount such that the blend contains a bromine content of from about 8 to about 20 percent by weight based on the combined weight of components (A) and (B); and component (B) has a weight average molecular weight of from about 2,000 to about 600,000.

3. A blend of claim 1 wherein components (A) and (B) are present in an amount such that the blend contains a bromine content of from about 10 to about 18 percent by weight based on the combined weight of components (A) and (B); and component (B) has a weight average molecular weight of from about 2,000 to about 600,000.

4. A blend of claim 1, 2 or 3 wherein
   (a) component A is a polycyanate composition represented by the following formulas I, II, III or IV

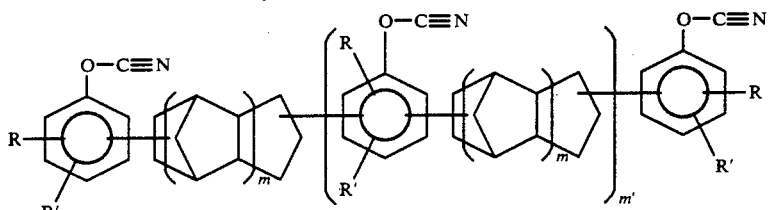

Formula I

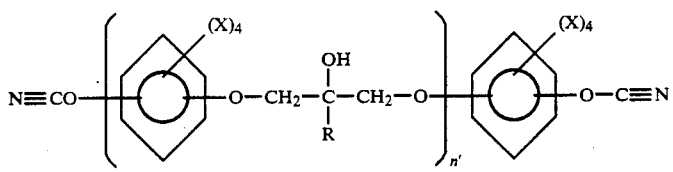

Formula II

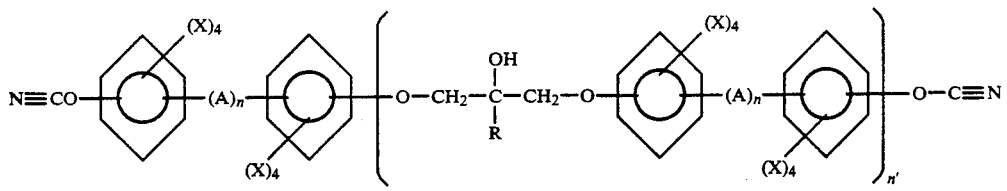

Formula III

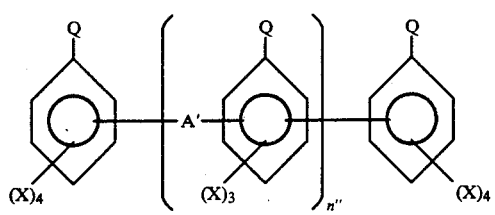

Formula IV wherein each A is independently a divalent hydrocarbyl group containing from 1 to about 12 carbon atoms, —S—, —S—S—, —SO—, —SO$_2$—, —O—, or —CO—: each A' is independently a divalent hydrocarbyl group containing from 1 to about 12 carbon atoms: each Q is independently a hydroxyl or —OCN group with the proviso that at least two of them are —OCN groups: each R and R' is independently hydrogen or a hydrocarbyl or hydrocarbyloxy group having from 1 to about 12 carbon atoms: R" is hydrogen or an alkyl group having from 1 to about 4 carbon atoms: each X is independently hydrogen or a hydrocarbyl group containing from 1 to about 12 carbon atoms: each m independently has a value from zero to about 6; m' has a value from zero to about 4; n has a value of zero or 1; n' has an average value from zero to about 5; and n" has an average value from about 0.001 to about 4;

(b) component (B) is a brominated homopolymer or brominated interpolymer of styrene, o-methylstyrene, p-methylstyrene, p-methylstyrene, 2,4-dimethylstyrene, 2,5-dimethylstyrene p-tertbutylstyrene, p-chlorostyrene, α-methylstyrene, or any combination thereof: and (c) component (B) contains from about 24 to about 70 percent bromine by weight: has a weight average molecular weight (Mw) of from about 750 to about 700,000.

5. A blend of claim 4 wherein (a) in component (A), each A is independently a divalent hydrocarbyl group containing from 1 to about 6 carbon atoms: each A' is independently a divalent hydrocarbyl group containing from 1 to about 6 carbon atoms: each Q is independently a hydroxyl or —OCN group with the proviso that at least two of hydrogen or a hydrocarbyl or hydrocarbyloxy group having from 1 to about 6 carbon atoms: R" is hydrogen or an alkyl group having from 1 to about 4 carbon atoms: each X is independently hydrogen or a hydrocarbyl group containing from 1 to about 6 carbon atoms: each m independently has a value from 1 to about 3; m' has a value from zero to about 2; n has a value of 1; n' has an average value from zero to about 3; and n" has an average value from about 0.001 to about 2:

(b) component (B) is brominated polystyrene: and (c) component (B) contains from about 50 to about 68 percent bromine by weight: has a weight average molecular weight (Mw) of from about 2,000 to about 600,000.

6. A blend of claim 4 wherein (a) in component (A), each A is independently a divalent hydrocarbyl group containing from 1 to about 4 carbon atoms: each A' is independently a divalent hydrocarbyl group containing from 1 to about 4 carbon atoms: each Q is independently a hydroxyl or —OCN group with the proviso that at least two of them are —OCN groups: each R and R' is independently hydrogen or a hydrocarbyl or hydrocarbyloxy group having from 1 to about 4 carbon atoms: R" is hydrogen or an alkyl group having from 1 to about 4 carbon atoms: each X is independently hydrogen or a hydrocarbyl group containing suitably from 1 to about 4 carbon atoms: each m independently has a value from 1 to about 2; m' has a value from zero to about 2; n has a value of 1; n' has an average value from zero to about 2; and n" has an average value from about 0.001 to about 1;

(b) component (B) is brominated polystyrene: and (c) component (B) contains from about 55 to about 68 percent bromine by weight: has a weight average molecular weight (Mw) of from about 2,000 to about 500,000.

7. A blend of claim 4 wherein (a) component (A) is a cyanate containing compound represented by formula I, bisphenol A dicyanate, methylene bis (3,5 dimethylphenyl-4-cyanate) or 4,4'-thiodiphenylcyanate: and (b) component (B) is brominated polystyrene or polymers of (1) monobromostyrene, (2) dibromostyrene, (3) tribromostyrene, (4) $C_1$-$C_4$ alkylmonobromostyrene, (5), $C_1$-$C_4$ alkyldibromostyrene, or (6) any combination thereof.

8. A blend of claim 5 wherein component (A) is a cyanate containing compound represented by formula I.

9. A blend of claim 6 wherein component (A) is a cyanated dicyclopentadi resin.

10. A curable composition comprising a blend of claim 1 and a curing amount of at least one curing agent therefor.

11. A curable composition comprising a blend of claim 9 and a curing amount of at least one curing agent therefor.

12. An article resulting from curing a composition of claim 10.

13. An article resulting from curing a composition of claim 11.

14. A preimpregnated substrate comprising a reinforcing material impregnated with a curable composition of claim 10.

15. A preimpregnated substrate comprising a reinforcing material impregnated with a curable composition of claim 11.

16. A laminate or composite material comprising subjecting to heat and pressure, one or more plies of a preimpregnated substrate of claim 14.

17. A laminate or composite material comprising subjecting to heat and pressure, one or more plies of a preimpregnated substrate of claim 15.

18. An electrical laminate comprising subjecting to heat and pressure one or more plies of a preimpregnated substrate of claim 14 and at least one outer ply of an electrical conducting material.

19. An electrical laminate comprising subjecting to heat and pressure one or more plies of a preimpregnated substrate of claim 15 and at least one outer ply of an electrical conducting material.

* * * * *

UNITED STATES PATENT AND TRADEMARK OFFICE
CERTIFICATE OF CORRECTION

PATENT NO. : 5,091,476

DATED : February 25, 1992

INVENTOR(S) : Georgia A. Monnerat

Page 1 of 2

It is certified that error appears in the above-identified patent and that said Letters Patent is hereby corrected as shown below:

Column 20, line 66, change "CO-:" to read --CO-;--.

Column 20, line 68, change "atoms:" to read --atoms;--.

Column 21, line 2, change "groups:" to read --groups;--.

Column 21, line 5, change "atoms:" to read --atoms;--.

Column 21, line 6, change "atoms:" to read --atoms;--.

Column 21, line 8, change "atoms:" to read --atoms;--.

Column 21, line 19, change "thereof:" to read --thereof;--.

Column 21, line 21, change "weight:" to read --weight;--.

Column 21, line 27, change "atoms:" to read --atoms;--.

Column 21, line 29, change "atoms:" to read --atoms;--.

Column 21, line 31, change "of hydrogen" to read --of the are -OCN groups; each R and $R^1$ is independently hydrogen--.

Column 21, line 32, change "atoms:" to read --atoms;--.

Column 21, line 34, change "atoms:" to read --atoms;--.

Column 21, line 36, change "atoms:" to read --atoms;--.

Column 21, line 40, change "2:" to read --2;--.

Column 21, line 41, change "polystyrene:" to read --polystyrene;--.

UNITED STATES PATENT AND TRADEMARK OFFICE
CERTIFICATE OF CORRECTION

PATENT NO. : 5,091,476
DATED : February 25, 1992
INVENTOR(S) : Georgia A. Monnerat It is certified that error appears in the above-indentified patent and that said Letters Patent is hereby corrected as shown below:

Column 21, line 43, change "weight:" to read --weight;--.

Column 21, line 49, change "atoms:" to read --atoms;--.

Column 21, line 51, change "atoms:" to read --atoms;--.

Column 21, line 53, change "groups:" to read --groups;--.

Column 21, line 56, change "atoms:" to read --atoms;--.

Column 21, line 57, change "atoms:" to read --atoms;--.

Column 22, line 2, change "atoms:" to read --atoms;--.

Column 22, line 7, change "polystyrene:" to read --polystyrene;--.

Column 22, line 9, change "weight:" to read --weight;--.

Column 22, line 16, change "thiodiphenylcyanate:" to read --thiodiphenylcyanate;--.

Column 22, line 25, change "dicyclopentadi resin." to read --dicyclopentadiene-phenol resin.--.

Signed and Sealed this

Twenty-eighth Day of September, 1993

*Attest:*

BRUCE LEHMAN

*Attesting Officer*    *Commissioner of Patents and Trademarks*